United States Patent [19]
Sugiyama et al.

[11] Patent Number: 6,112,171
[45] Date of Patent: *Aug. 29, 2000

[54] METHODS OF EFFICIENTLY RECORDING AND AUDIO SIGNAL IN SEMICONDUCTOR MEMORY

[75] Inventors: Kazuhiro Sugiyama; Yukari Ono; Yoshinobu Ishida, all of Nagaokakyo, Japan

[73] Assignee: Mitsubishi Denki Kabushiki Kaisha, Tokyo, Japan

[ * ] Notice: This patent is subject to a terminal disclaimer.

[21] Appl. No.: 09/037,623

[22] Filed: Mar. 10, 1998

Related U.S. Application Data

[62] Division of application No. 08/671,640, Jun. 28, 1996, Pat. No. 5,774,843.

[30] Foreign Application Priority Data

Apr. 20, 1992 [JP] Japan .................................... 4-099647
Jul. 24, 1992 [JP] Japan .................................... 4-198463
Jul. 24, 1992 [JP] Japan .................................... 4-198464

[51] Int. Cl.[7] .................................................. G10L 19/02
[52] U.S. Cl. ......................... 704/229; 704/230; 704/203; 704/500; 704/502; 369/48
[58] Field of Search .................................... 704/229, 500, 704/201, 203, 230, 502; 369/48, 59, 60, 58

[56] References Cited

U.S. PATENT DOCUMENTS

| | | | |
|---|---|---|---|
| 5,495,552 | 2/1996 | Sugiyama et al. | 704/201 |
| 5,630,010 | 5/1997 | Sugiyama et al. | 704/201 |
| 5,752,221 | 5/1998 | Sugiyama et al. | 704/201 |
| 5,765,127 | 6/1998 | Nishiguchi et al. | 704/208 |
| 5,774,843 | 6/1998 | Sugiyama et al. | 704/229 |
| 5,864,801 | 1/1999 | Sugiyama et al. | 704/229 |
| 5,878,388 | 3/1999 | Nishiguchi et al. | 704/214 |

FOREIGN PATENT DOCUMENTS 1191124  12/1962  Germany .

*Primary Examiner*—David R. Hudspeth
*Assistant Examiner*—Vijay B Chawan

[57] ABSTRACT

An audio signal is recorded in a semiconductor memory in a plurality of hierarchical levels, with the lowest level being adequate for reproduction with a certain reduced degree of fidelity. Successively higher hierarchial levels provide successively greater fidelity when reproduced. When the memory has been determined to have reached maximum capacity, recording continues by overwriting the highest hierarchical level of data currently stored in the memory with lower hierarchical levels of new data. A code is recorded in the memory, indicating the number of hierarchical levels recorded therein, for subsequent reproduction. The audio signal can furthermore be recorded in variable-length frames and reproduced at high speed by reading every N-th frame, N being a positive integer, or by reading only frames having at least a certain minimum length.

21 Claims, 14 Drawing Sheets

FIG. 6

| ADDRESS | | | | | |
|---|---|---|---|---|---|
| 0 | 72 | 90 | 35 | 128 | 51 |
| 100 | 131 | 23 | 78 | 56 | 59 |
| 200 | 88 | 71 | 29 | 156 | 45 |
| 300 | 17 | 107 | 76 | 93 | 70 |
| ⋮ | ⋮ | ⋮ | ⋮ | ⋮ | ⋮ |
| 999 | | | | | |
| 1000 | 1 | | | 2 | |
| 1100 | | | 3 | | |
| 1200 | 4 | | | | |
| 1300 | | 5 | | 6 | |
| 1400 | | | | | |
| 1500 | 7 | 8 | | | |
| 1600 | 9 | | 10 | | |
| 1700 | | 11 | | | |
| 1800 | | 12 | | 13 | |
| 1900 | | 14 | | | |
| 2000 | | | | 15 | |
| 2100 | | 16 | 17 | | |
| 2200 | | | 18 | | |

14 SEMICONDUCTOR MEMORY

STAGE (1)

STAGE (2)

STAGE (3)

STAGE (4)

METHODS OF EFFICIENTLY RECORDING AND AUDIO SIGNAL IN SEMICONDUCTOR MEMORY

This application is a divisional of application No. 08/671,640, filed on Jun. 28, 1996, now U.S. Pat. No. 5,774,843 the entire contents of which are hereby incorporated by reference.

BACKGROUND OF THE INVENTION

This invention relates to efficient methods of recording an audio signal in a semiconductor memory and reproducing the recorded signal.

Semiconductor memories are used for recording and reproducing messages and other types of audio signals in many products and systems, including telephone sets, toys, and public address apparatus. Compared with magnetic tape recording, since it has no moving parts, semiconductor memory offers the advantages of small size, low power, long life, and high reliability, but a semiconductor memory has a limited data capacity. With conventional recording methods there is a fixed maximum limit, often measured only in seconds, on the length of the recording. If an attempt is made to record beyond this limit, part of the recording is inevitably lost.

One reason for these problems is that conventional systems lack a method of overwriting existing data without completely losing portions of the already-recorded signal.

SUMMARY OF THE INVENTION

It is accordingly an object of the present invention to continue recording an audio signal in a semiconductor memory after the semiconductor memory is determined to be full by overwriting existing data without completely losing any portion of the previously recorded signal.

Another object of the invention is to enable an audio signal recorded in the semiconductor memory to be reproduced at a higher speed than the recording speed.

According to a first aspect of the invention, the digitized audio data are encoded into a plurality of successive hierarchical levels of data. The lowest hierarchical level is adequate for reproduction of the audio signal with a certain reduced or lowered degree of fidelity. Successive higher hierarchical levels provide additional data for successively greater fidelity. All of the hierarchical levels of data are recorded in the semiconductor memory until the semiconductor memory reaches maximum storage capacity. After that, recording continues by overwriting the highest hierarchical level of data recorded in the semiconductor memory with lower hierarchical levels of new data. This process can continue up until the time that the semiconductor memory is filled with only the lowest hierarchical level of data. At the end of the recording, a code is recorded in the semiconductor memory indicating the number of hierarchical levels recorded therein, for subsequent reproduction.

According to a second aspect of the invention, all hierarchical levels are stored in a buffer memory. Thereafter, as many hierarchical levels as possible are copied into the semiconductor memory.

According to a third aspect of the invention, the data are recorded in variable-length frames, and only frames having at least a certain minimum length are reproduced.

According to a fourth aspect of the invention every N-th frame is reproduced, where N is a positive integer.

According to a fifth aspect of the invention, the data are reproduced at a variable clock rate, the number of hierarchical levels reproduced being selected according to the clock rate.

These and other objects of the present application will become more readily apparent from the detailed description given hereinafter. However, it should be understood that the preferred embodiments of the invention are given by way of illustration only, since various changes and modifications within the spirit and scope of the invention will become apparent to those skilled in the art from this detailed description.

BRIEF DESCRIPTION OF THE DRAWINGS

FIG. 6 is a memory map illustrating the storage of encoded audio data.

DETAILED DESCRIPTION OF THE INVENTION

The invention will now be described in more detail with reference to the attached drawings. The drawings are supplied as illustrations of the invention, but they do not restrict the scope of the invention, which should be determined solely from the appended claims.

First a method of recording audio data in variable-length frames will be described. This method enables the audio data to be reproduced in various useful high-speed modes.

Figure 1:
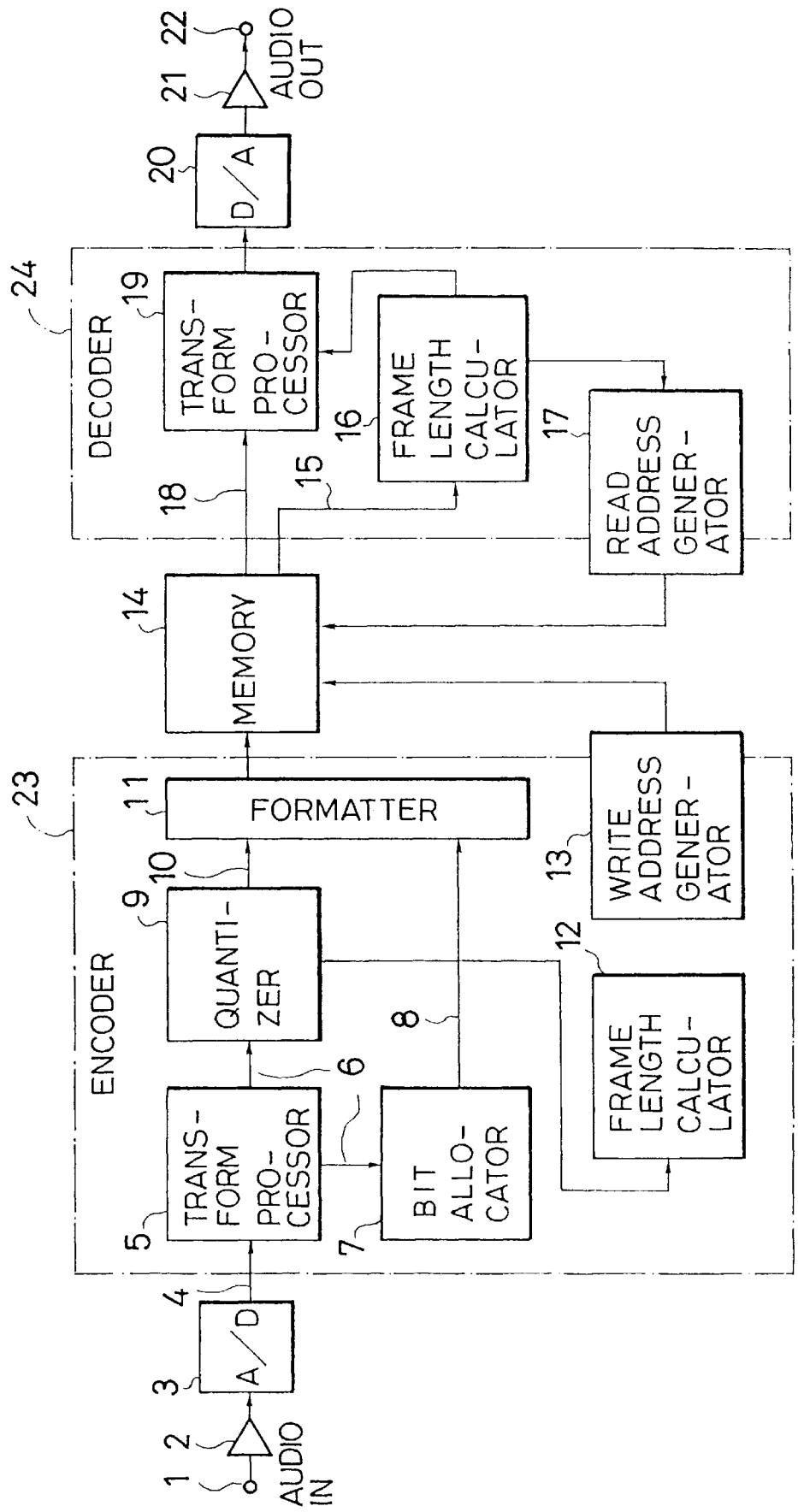
FIG. 1 is a block diagram of a system for recording audio signals in a semiconductor memory, and reproducing the recorded signals.

Referring to FIG. 1, an audio signal is input at an input terminal 1, amplified to an appropriate level by an audio amplifier 2, and converted by an analog-to-digital converter 3 to digital audio data 4. The digital audio data 4 are supplied to a transform processor 5 and converted to frequency coefficients 6. The frequency coefficients 6 are supplied to a bit allocator 7, which calculates a bit allocation information 8. The frequency coefficients 6 and bit allocation information 8 are both furnished to a quantizer 9, which generates quantized frequency coefficients 10. The bit allocation information 8 and quantized frequency coefficients 10 are sent to a formatter 11, which formats them into output data. The bit allocation information 8 is also sent to a frame length calculator 12, which calculates frame lengths. On the basis of the calculated frame lengths, a write address generator 13 generates addresses at which the output data from the formatter 11 are written into a semiconductor memory 14.

To reproduce the audio signal, bit allocation information 15 is read from the semiconductor memory 14 into another frame length calculator 16, which has a buffer for storing the bit allocation information 15. On the basis of frame length calculated by the frame length calculator 16, a read address generator 17 generates addresses at which quantized frequency coefficients 18 are read from the semiconductor memory 14 into an inverse transform processor 19, which also receives bit allocation information from the frame length calculator 16. The inverse transform processor 19 converts the quantized frequency coefficients 18 to digitized audio data, which are sent to a digital-to-analog converter 20 and converted to an analog signal. The analog signal is amplified by an audio amplifier 21 and output at an output terminal 22.

The transform processor 5, bit allocator 7, quantizer 9, formatter 11, frame length calculator 12, and write address generator 13 form an encoder 23. The frame length calculator 16, read address generator 17, and inverse transform processor 19 form a decoder 24. The encoder 23 and the decoder 24 can be implemented using a digital signal processor programmed to perform the necessary transformations, allocations, and other calculations. Alternatively, the individual elements of the encoder 23 and decoder 24 can be implemented as separate processor elements specially adapted to perform their individual functions. It is also possible for the encoder 23 and decoder 24 to be implemented by programs running on a general-purpose microprocessor or other processor, each of the elements of the encoder 23 and the decoder 24 corresponding to an individual program module. Digital signal processors and microprocessors are well known, and methods of programming them to carry out the functions shown in FIG. 1 will be readily apparent to those skilled in the art. Accordingly, a description of hardware and software details will be omitted. The invention is not restricted to any particular implementation of the system illustrated in FIG. 1.

The operation of the encoder 23 and decoder 24 will next be described in more detail.

The digitized audio data 4 received by the transform processor 5 comprise digitized samples of the audio signal, grouped into blocks of a fixed number of samples each. All blocks thus represent equal periods of time. The transform processor 5 execute a time-domain-to-frequency-domain transformation such as a discrete cosine transformation on each block thereby converting the sample data in the block to a set of frequency coefficients 6.

Figure 2:
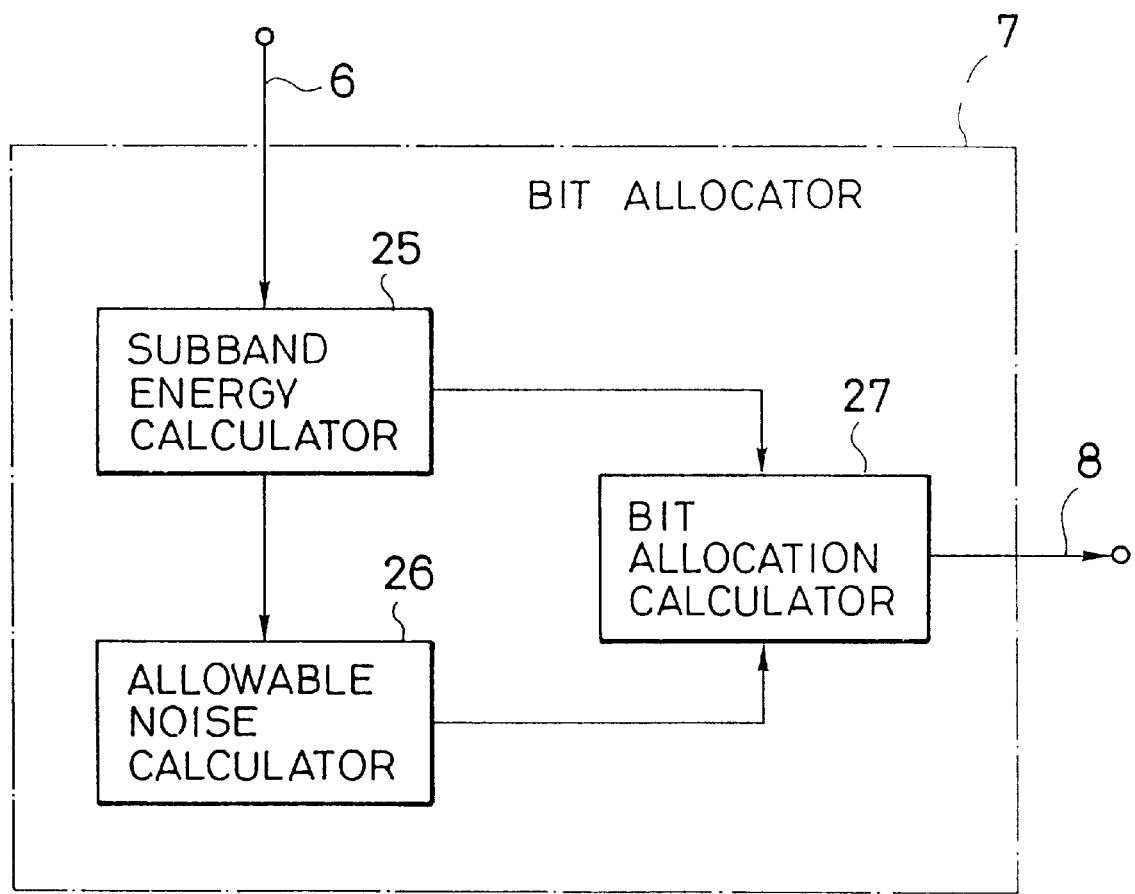
FIG. 2 is a block diagram of the bit allocator in FIG. 1.

Referring to FIG. 2, the bit allocator 7 comprises a subband energy calculator 25, an allowable noise calculator 26, and a bit allocation calculator 27. The subband energy calculator 25 divides the frequency coefficients 6 into a plurality of frequency subbands, and calculates the mean energy in each subband from the values of the frequency coefficients in that subband. On the basis of these mean energies, the allowable noise calculator 26 calculates an allowable noise level for each subband, taking into consideration such factors as the human auditory threshold and masking effects from adjacent subbands. The bit allocation calculator 27 subtracts the allowable noise level in each subband from the mean energy in that subband, and allocates a number of bits according to the difference.

Figure 3:
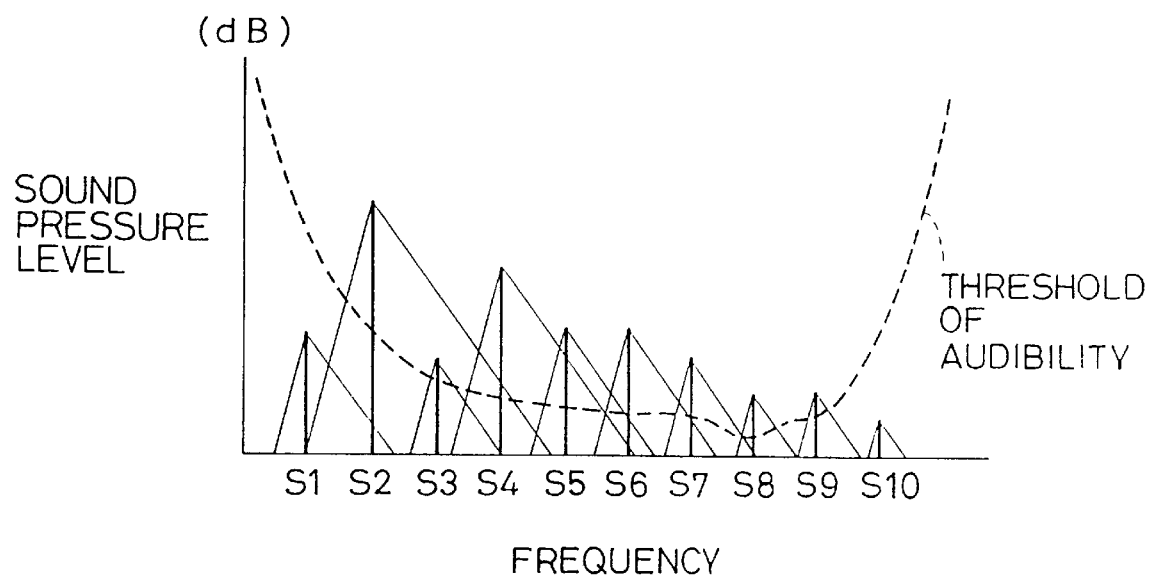
FIG. 3 is a graph illustrating mean energy levels, masking, and the threshold of audibility.
Figure 4:
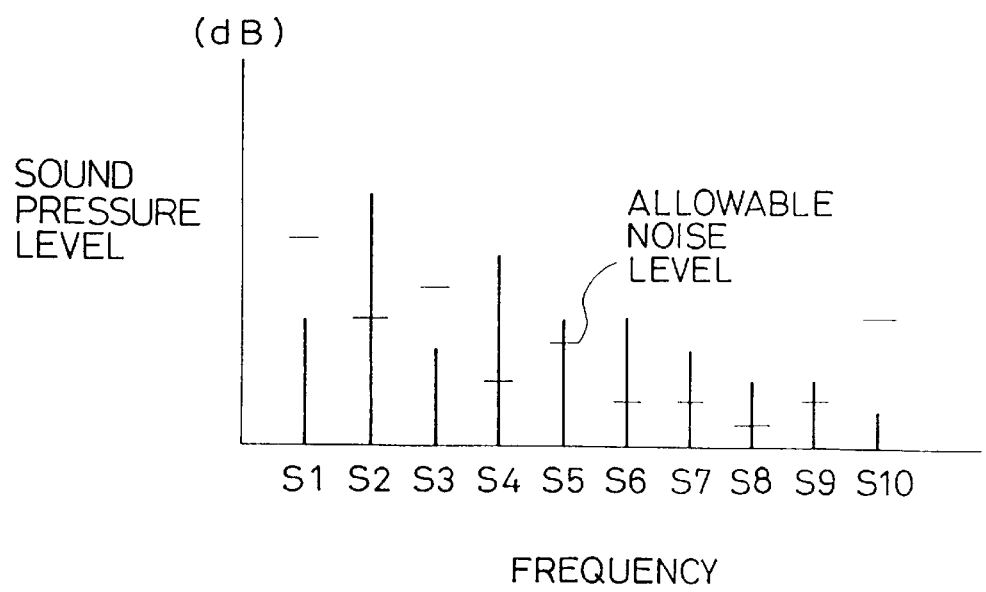
FIG. 4 is a graph illustrating mean energy levels and allowable noise levels.

The operation of the subband energy calculator 25 and allowable noise calculator 26 is illustrated in the graphs in FIGS. 3 and 4. In both drawings the horizontal axis is the frequency axis, with frequency subbands indicated by the symbols S1, S2, . . . , S10. Sound power level is indicated in decibels on the vertical axis. The vertical lines above each frequency band symbol represent the mean sound power level, which is equivalent to the mean energy level, in that frequency subband.

In FIG. 3, the lines sloping from each vertical line represent the masking effect on adjacent frequency subbands. The dotted line represents the human threshold of audibility. Noise is allowable if it is below this threshold, or if it is masked by audio signal components in adjacent frequency subbands. The allowable noise level is therefore given by the maximum envelope of the sloping and dotted lines. The allowable noise level in each subband is indicated by a short horizontal line in FIG. 4.

The bit allocation information 8 for each frame comprises one value for each frequency subband, specifying the number of bits used to encode frequency coefficients in that subband. The quantizer 9 truncates the frequency coefficients 6 received from the transform processor 5 to the specified number of bits, thereby generating the quantized frequency coefficients 10.

Figure 5:
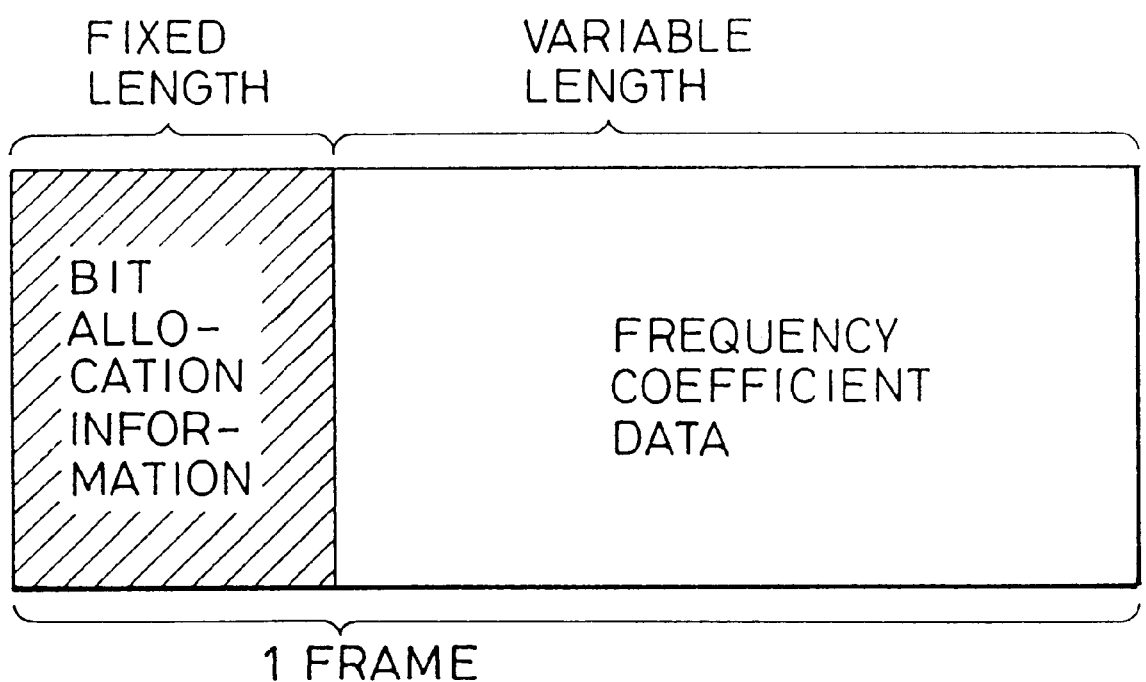
FIG. 5 illustrates the format of a variable-length frame of encoded audio data.

The bit allocation information 8 itself has a fixed length. The total bit length of the quantized frequency coefficients depends on the characteristics of the audio signal and is highly variable. The formatter 11 formats the bit allocation information 8 and the quantized frequency coefficients 10 as shown in FIG. 5 to create a frame with a fixed-length part accommodating the bit allocation information 8 and a variable-length pat accommodating the quantized frequency coefficients 10.

From the bit allocation information in each frame the frame length calculator 12 calculates the frame length and the write address generator 13 calculates the addresses at which the frame should be stored in the semiconductor memory 14. Semiconductor memory is randomly addressable, so it is not necessary to store every frame in a single extent of contiguous addresses. For example, bit allocation information 8 can be stored in one area of the semiconductor memory 14, and quantized frequency coefficients 10 in another area.

FIG. 6 shows an example of this storage scheme. Bit allocation information is stored at addresses zero to nine hundred ninety-nine; quantized frequency coefficients are stored at address one thousand and higher addresses. The bit allocation information for each frame is stored in a twenty-bit block. The numbers shown inside there blocks represent the total bit length of the quantized frequency coefficients in one frame, as calculated from the bit allocation information stored in the block. The circled numbers in the frequency coefficient data area are frame numbers.

The system illustrated in FIGS. 1 to 6 records audio data efficiently and with a constant perceived fidelity level. In a recording of a spoken message, for example, frames in which the speaker is speaking in a load voice with strongly marked frequency characteristics receive high bit allocations. Frames in which the speaker is speaking more quietly, or in a flatter tone, receive reduced bit allocations, since these frames contain less audio information and can be reproduced just as faithfully with fewer bits. Frames in which the speaker is silent receive bit allocations of zero. By reducing the bit allocations for frames having low information content in this way, the novel method can significantly extend the recording time as compared with conventional methods.

Next the operation of the decoder 24 will be described, with reference to FIGS. 1 and 6.

When the audio data are reproduced, the bit allocation information 15 is read from the semiconductor memory 14 and stored in the bit allocation information buffer in the frame length calculator 16. From this information the frame length calculator 16 calculates the length of the quantized frequency coefficients in each frame, i.e. it calculates the frame length values indicated in FIG. 6. From these values, the read address generator 17 calculates the starting address of the quantized frequency coefficients in each frame, for example by adding one thousand to the sum of the lengths of the preceding frame. The read address generator 17 sends the semiconductor memory 14 this starting address, followed by the addresses of the rest of the quantized frequency coefficients in the frame, causing the semiconductor memory 14 to output the quantized frequency coefficients 18 to the inverse transform processor 19. Using the bit allocation information stored in the bit allocation information buffer in the frame length calculator 16, the inverse transform processor 19 performs a frequency-domain-to-time-domain transformation such as an inverse discrete cosine transform to convert the quantized frequency coefficients 18 to digitized audio sample data.

One of the objects of the invention is to enable the audio signal to be reproduced at a higher speed than the recording speed. With the apparatus of FIGS. 1 to 6, this can be accomplished by skipping frames as described next.

In one mode every N-th frame is read, where N is a positive integer. If N is equal to one, all frames of the audio signal are reproduced at normal speed. If N is greater than one, frames are skipped and the reproduced signal is speeded up. To speed up the reproduced signal by a factor of five, for example, the decoder 24 can read and decode the quantized frequency coefficients 10 for every fifth frame, e.g. frames one, six, eleven, and the other frame with frame numbers enclosed in double circles in FIG. 6. This enable a voice message, for example, to be speeded up without altering its frequency components, as if the speaker were speaking very rapidly but at a normal pitch. This method depends on the property that all frames represent equal time periods.

In another high-speed mode, the decoder 24 skips all frames having less than a certain length. Such frames include silent frames, in which all coefficients of the frequency coefficients 6 are below the threshold of audibility and all bit allocations are zero. They also include frames containing only ambient noise, in which the mean energy level is low in all frequency subbands and all bit allocations are very small. This mode is extremely useful for playing back a recording of a meeting or conversation, since it selects only those frames in which the participants were actually speaking. This high-speed mode can be implemented by having the read address generator 17 in FIG. 1 generate addresses only if the frame length has at least a certain minimum value. This method does not depend on the property that all frames represent equal time periods.

Besides permitting these high-speed reproducing modes, variable-frame-length recording enables space in the semiconductor memory to be used efficiently. However, the problem remains of what to do if the memory reaches maximum storage capacity or becomes full before the recording is finished. Rather than simply stop recording and risk loss of potential important information, it would obviously be preferable to sacrifice a certain degree of audio fidelity in order to continue recording. A method of achieving this by hierarchical encoding will be described next.

Figure 7:
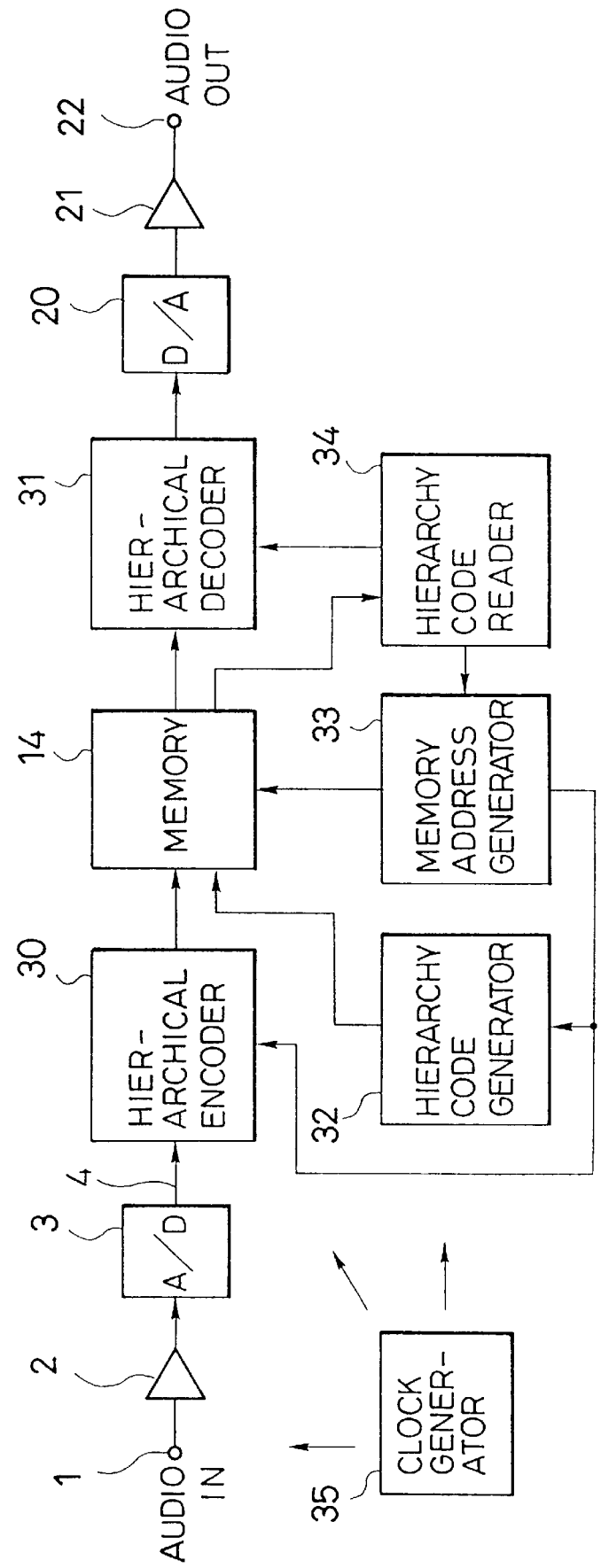
FIG. 7 is a block diagram of a system for hierarchically recording and reproducing audio signals.

An example of a hierarchical recording and reproducing system is shown in FIG. 7. Elements identical to elements in FIG. 1 have the same reference numerals. The new elements, which replace the encoder 23 and decoder 24 in FIG. 1, are: a hierarchical encoder 30 that hierarchically encodes the digitized audio data 4 received from the analog-to-digital converter 3; a hierarchical decoder 31 that hierarchically decodes data read from the semiconductor memory 14; a hierarchy code generator 32 that supplies the hierarchical encoder 30 and the semiconductor memory 14 with a hierarchy code representing a hierarchical level; a memory address generator 33 that generates memory addresses for the semiconductor memory 14, the hierarchical encoder 30, and the hierarchy code generator 32; a hierarchy code reader 34 that reads a hierarchy code from the semiconductor memory 14 and supplies hierarchical information to the hierarchical decoder 31 and the memory address generator 33; and a clock generator 35 that generates clock signals for the other elements.

Figure 8:
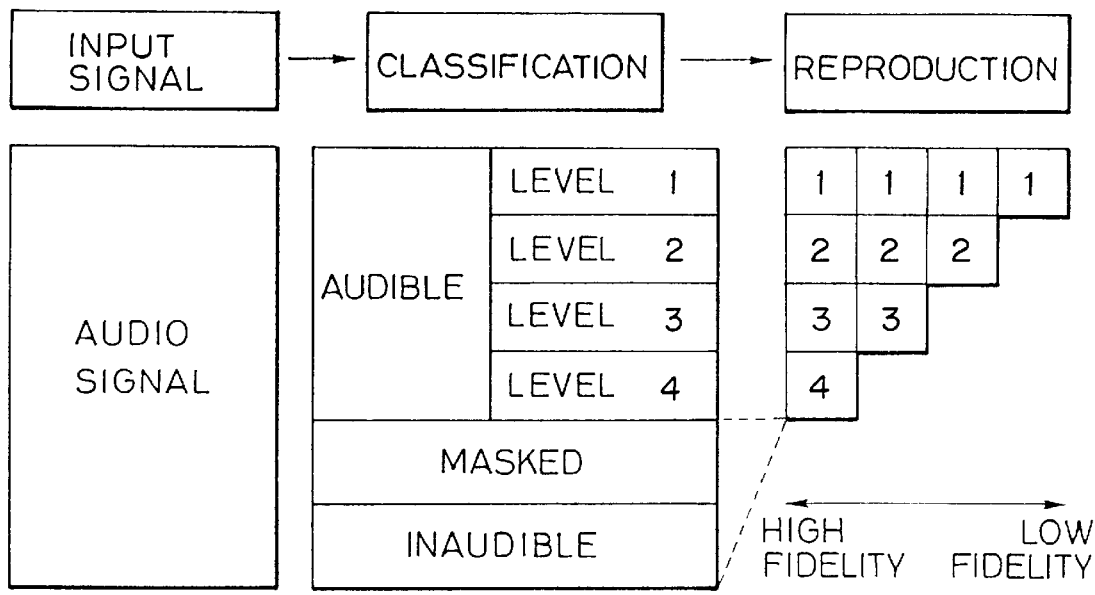
FIG. 8 illustrates a hierarchical classification of audio signal data.

FIG. 8 schematically illustrates the hierarchical recording method. The original input signal can first be analyzed into three components; an inaudible component that lies below the threshold of audibility; a masked component comprising frequencies masked by stronger frequencies in adjacent subbands; and an audible component. This is essentially the same scheme that was illustrated in FIGS. 3 and 4. As before, only the audible component is recorded.

The audible component is further divided into four hierarchical levels, indicated by circled numerals from one to four. Highest fidelity is obtained by recording and reproducing all four hierarchical levels. Somewhat lower fidelity is obtained by recording and reproducing only the first three hierarchical levels. Still lower fidelity is obtained by recording and reproducing only the first two hierarchical levels. Even lower, but still recognizable, fidelity is obtained by recording and reproducing only the first hierarchical level, indicated by the circled numeral one.

Figure 9:
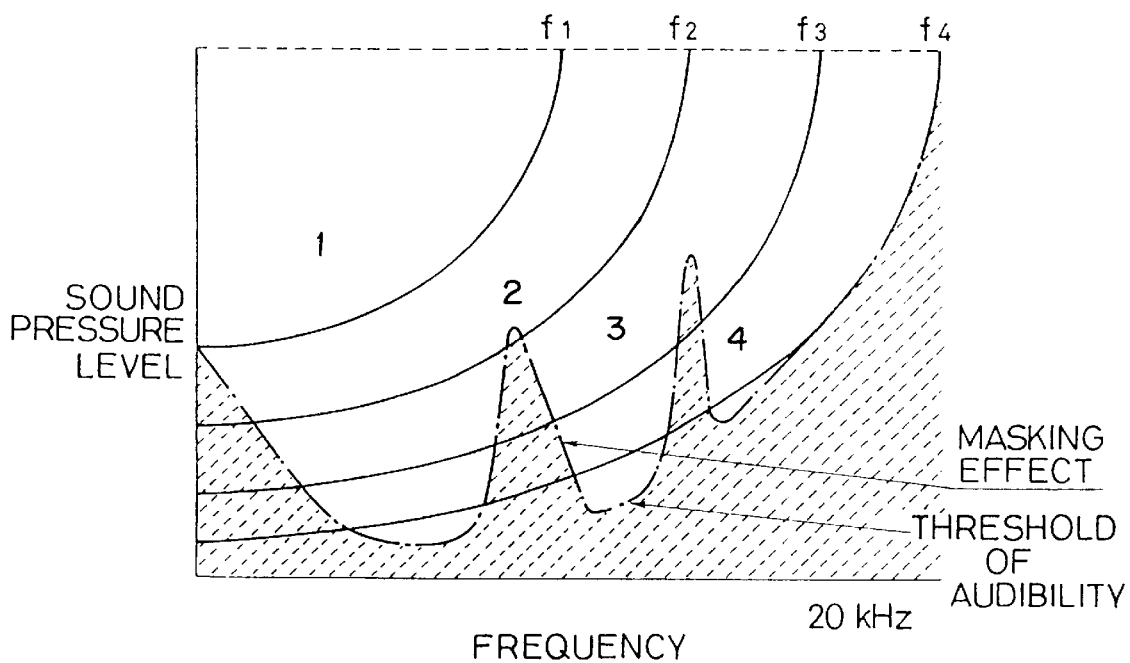
FIG. 9 is a graph illustrating the hierarchical classification scheme of FIG. 8.

FIG. 9 illustrates the four hierarchical levels in a graph showing the frequency-sound-pressure-level plane, with frequency on the horizontal axis and sound pressure level on the vertical axis. The audibility threshold curve and masking curve are substantially as explained in FIG. 3, the shape of the masking curve varying depending on signal characteristics. The first hierarchical level includes signal components disposed above these curves and within the curved line that terminates at $f_1$. Accordingly, the first hierarchical level includes components that exceed a sound pressure level boundary that increases with increasing frequency, becoming substantially infinite at frequency $f_1$. In non-technical language, the first hierarchical level includes loud, low-pitched sounds.

The second hierarchical level includes components disposed between the curved lines that terminate at $f_1$ and $f_2$, excluding components that are inaudible or masked. The third hierarchical includes components disposed between the curved lines that terminate at $f_2$ and $f_3$, again excluding components that are inaudible or masked. The fourth hierarchical level includes components disposed between the curved lines that terminate at $f_3$ and $f_4$, once again excluding components that are inaudible or masked. Compared with the first hierarchical level, these other hierarchical levels include progressively softer sounds and progressively higher-pitched sounds.

The invention is of course not limited to four hierarchical levels; the number of levels may be either less than or greater than four.

Figure 10:
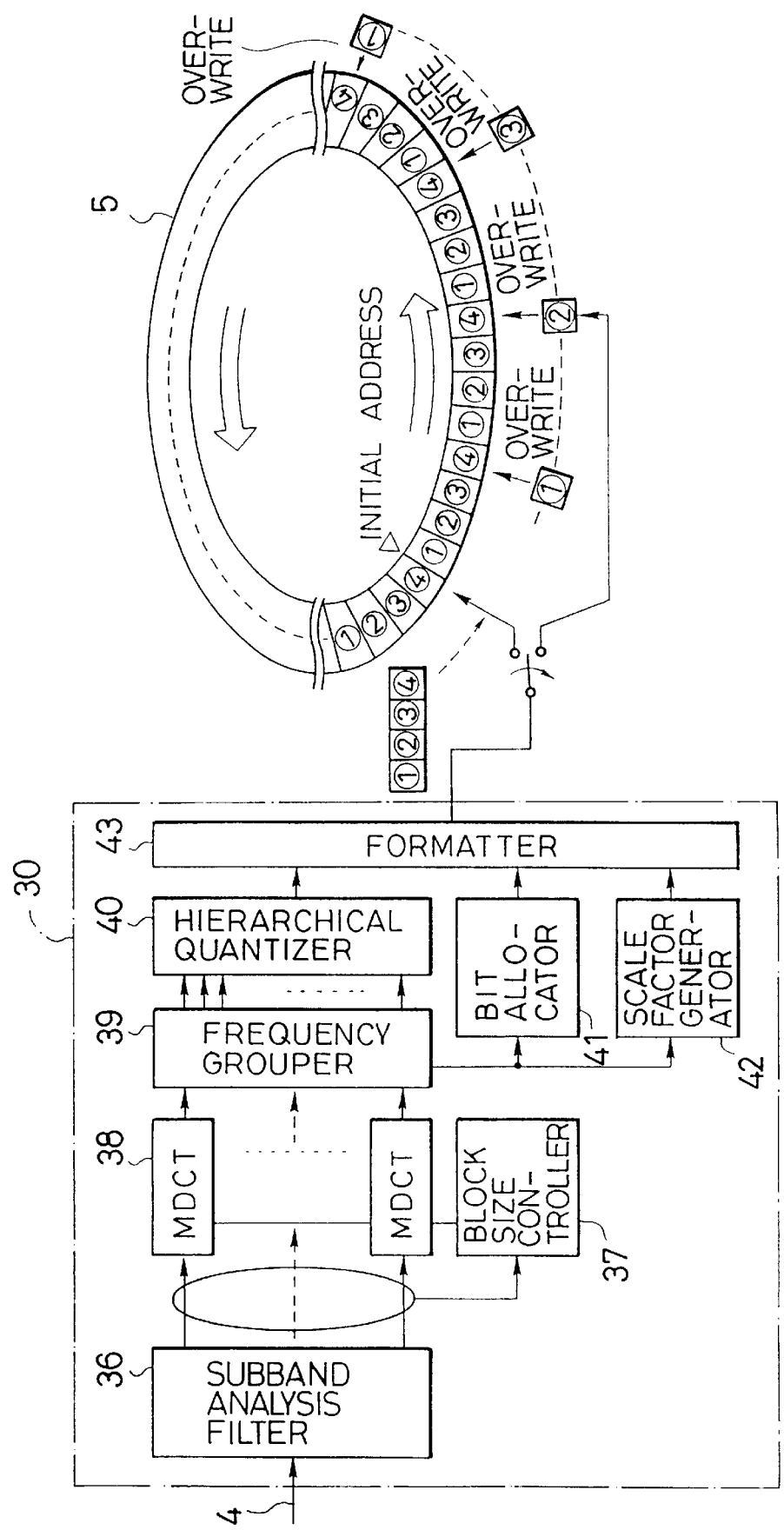
FIG. 10 is a more detailed block diagram of the hierarchical encoder in FIG. 7, also illustrating the overwriting of data.

FIG. 10 shows a possible structure of the hierarchical encoder 30 in FIG. 7, and illustrates the recording scheme. The hierarchical encoder 30 comprises a subband analysis filter 36, a block size controller 37, a plurality of orthogonal transform processors 38, a frequency grouper 39, a hierarchical quantizer 40, a bit allocator 41, a scale factor generator 42, and a formatter 43.

The subband analysis filter 36 is the digital equivalent of an analog filter bank; it analyzes the incoming digitized audio data into a plurality of frequency subbands, generating time-domain data in each subband. The block size controller 37 analyzes the variations in these subbands and selects a suitable block size, the block size decreasing with increasing variation. Blocks of audio data of the selected size are input to the orthogonal transform processors 38. The block size is the same for each orthogonal transform processor 38, but varies from time to time depending on the content of the audio signal.

Each orthogonal transform processor 38 executes a modified discrete cosine transform (MDCT) on its input data, thereby transforming the signal components in one subband from the time domain to the frequency domain. The frequency coefficients output from each orthogonal transform processor 38 are supplied to the frequency grouper 39.

The modified discrete cosine transform belong to the class of orthogonal time-domain-to-frequency-domain transforms, but the invention is not limited to this transform or class of transform. Other time-domain-to-frequency-domain transforms can be used instead.

Taking advantage of the critical-band principle of human auditory psychology, the frequency grouper 39 reduces the amount of coefficient data received from the orthogonal transform processor 38 by grouping the coefficient data and combining grouped coefficients into single values. The number of coefficients thus grouped into a single value increases in higher frequency subbands, wherein human hearing is less acute. The frequency grouper 39 supplies the resulting grouped frequency coefficients to the hierarchical quantizer 40, the bit allocator 41, and the scale factor generator 42.

The hierarchical quantizer 40 separates the coefficients received from the frequency grouper 39 into the four hierarchical levels. Referring again to FIG. 9, one computational scheme begins by selecting, for the n-th hierarchical level, all data disposed above and to the left of the curve terminating at $f_n$ (where n=1, 2, 3, or 4) and above the curve representing the auditory threshold and masking level. It then subtracts the data disposed above and to the left of the curve terminating at $f_{n-1}$ and above the curve representing the auditory threshold and masking level. For the first hierarchical level, the selected data are used as is, without subtraction.

The bit allocator 41 in FIG. 10 performs the same function as the bit allocator 7 in FIG. 1, allocating different numbers of bits to different subbands according to the grouped frequency coefficients output from the frequency grouper 39. The scale factor generator 72 assigns scale factors so that data can be stored in floating-point form, thus enabling small values to be stored without loss of significant bits. The formatter 43 scales and truncates the hierarchical data from the hierarchical quantizer 40 according to the number of bits allocated by the bit allocator 41 and scale factors provided by the scale factor generator 42, formats the data, and provides as output data four hierarchical levels of frequency data, together with block size information, bit allocation information, and scale factor information, thereby generating one frame of data.

As additional audio data are received the foregoing process is repeated, and the frames of data thus generated are recorded as conceptually shown at the right in FIG. 10. Starting from an initial address, first the four hierarchical levels of data of the first frame are recorded. Thereafter the four hierarchical levels of data of the next frame are recorded, and so on. The memory address generator 33 in FIG. 7 generates the necessary memory addresses, and also monitors the addresses. When the memory addresses return to the initial address, the memory address generator 33 notifies the hierarchical encoder 30 and the hierarchy code generator 32 in FIG. 7, and the memory address generator 33 and hierarchical encoder 30 switch to an overwriting mode. In this mode only the first three hierarchical levels of data are stored. The first three hierarchical levels of data in the next frame are overwritten on the fourth hierarchical level of data in the first three frames. Since the first three hierarchical levels of the first three frames are left intact, these frames can be reproduced with only a slight loss of fidelity.

If the address again returns to the initial address, the memory address generator 33 notifies the hierarchical encoder 30 and hierarchy code generator 32. The mode then switches again, now writing only the first two hierarchical levels of data and generating addresses to overwrite already-recorded data in the third hierarchical level. At the end of the recording, the hierarchy code generator 32 writes a code to indicate the maximum hierarchical level that can be reproduced.

FIGS. 11A–D illustrate this recording scheme in the form of four memory maps. The memory map (FIG. 11A) at the left illustrates a recording that ended before any overwriting became necessary. Control information, including block size information, bit allocation information, and a hierarchy code of "11" is written at the top of the memory. The rest of the memory contains frequency coefficient data and scale factor information recorded in the four hierarchical levels, separated into different address sections as indicated by the circled numerals from one to four.

Figure 11A:
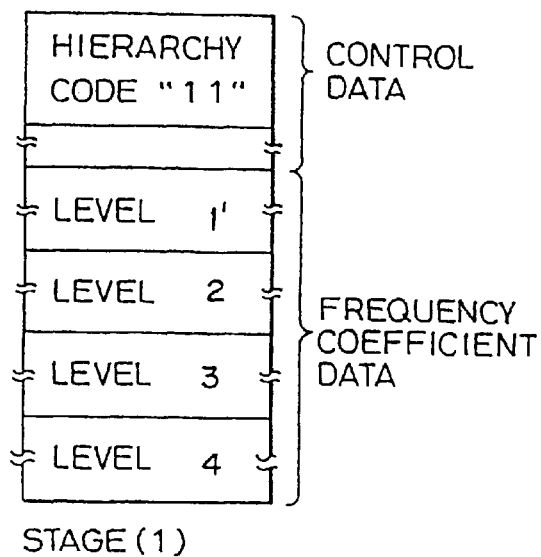
FIGS. 11A–D are memory maps illustrating the successive overwriting of hierarchical levels of data.
Figure 11B:
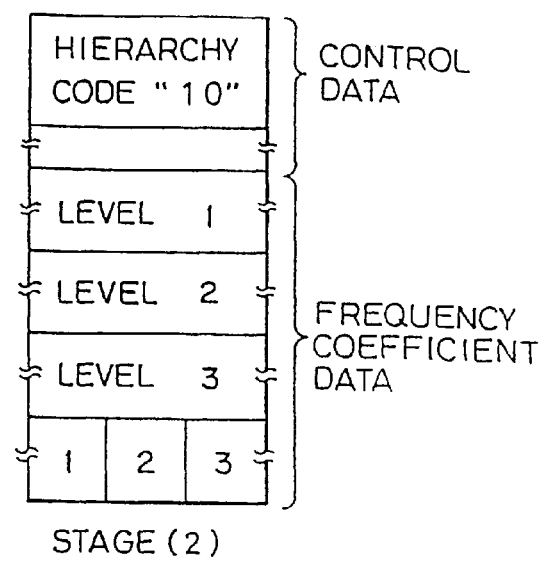
Figure 11C:
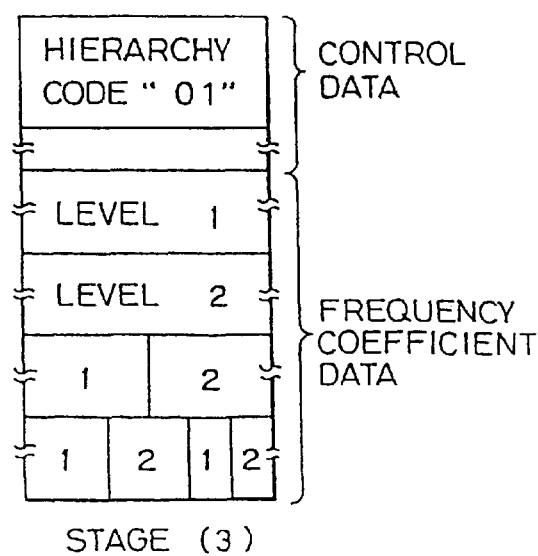
Figure 11D:
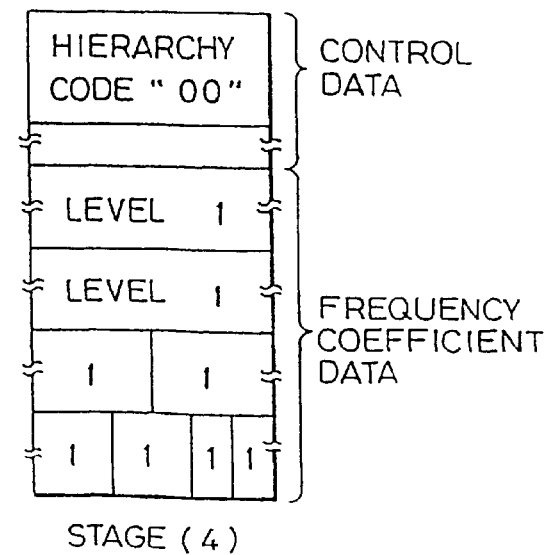

When the semiconductor memory 14 becomes full, new data belonging to the first three hierarchical levels are stored in the fourth section, overwriting the fourth hierarchical level, as illustrated in the second memory map (FIG. 11B). If the recording ends in this mode, the hierarchy code generator 32 writes the hierarchy code "10" in the control section. If the recording does not end, further data belonging to the first two hierarchical levels are stored in areas that previously held data of the third hierarchical level, as illustrated in the third memory map (FIG. 11C). If the recording ends in this mode, the hierarchy code generator 32 writes the hierarchy code "01" in the control section. If the recording continues, new data belonging to the first hierarchical level are now stored in areas that previously held data of the second hierarchical level, as illustrated in the fourth memory map (FIG. 11D). Further, the hierarchy code generator 32 writes the hierarchy code "00" in the control section. The recording can accordingly continue until the semiconductor memory 14 is filled with data of the first hierarchical level and no longer contains data of any higher hierarchical levels.

When the audio data are reproduced, first the hierarchy code reader 34 reads the hierarchy code in the control section of the semiconductor memory 14. It further notifies the hierarchical decoder 31 and memory address generator 33 of the number of hierarchical levels of data stored. The memory address generator 33 then generates memory addresses according to one of the memory maps in FIGS. 11A–11D, selecting the map indicated by the hierarchy code. The hierarchical decoder 31 reads the data stored at the addresses generated by the memory address generator 33 and decodes the data by a process generally inverse to the process illustrated in FIG. 10. It should be noted, however, that only the number of hierarchical levels indicated by the hierarchy code reader 34 are decoded. The decoded data are sent to the digital-to-analog converter 20 and converted to an analog signal. The analog signal is amplified by the audio amplifier 21 and output at the output terminal 22.

By falling back to progressively lower levels of audio fidelity, the invention as illustrated in FIGS. 7 to 11D enables recording time to be extended by a factor of four. If more hierarchical levels are used, then recording time can be extended even further. Increasing the number of hierarchical levels also has the advantage that audio fidelity degrades in smaller steps.

The recording scheme illustrated in FIGS. 8 to 11D permits another method of high-speed reproduction, in which all frames are reproduced, but higher hierarchical levels are omitted at higher speeds. A modification of the system in FIG. 7 to implement this high-speed mode will be described next.

Figure 12:
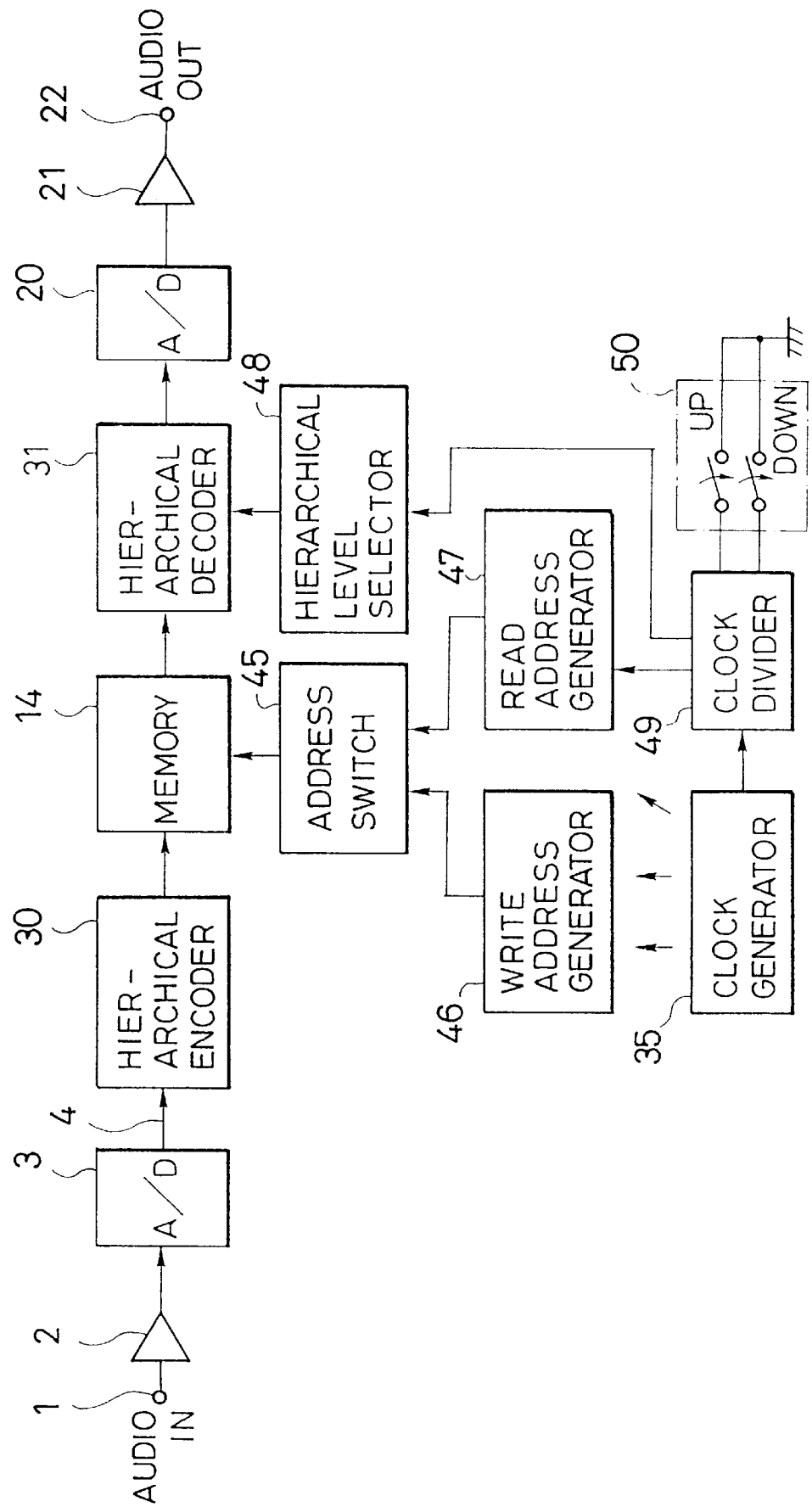
FIG. 12 is a block diagram of a system for hierarchically recording and reproducing audio signals, with provision for high-speed reproduction.

Referring to FIG. 12, the modified system has an address switch 45 that supplies addresses to the semiconductor memory 14 from either a write address generator 46 or a read address generator 47. Another new element is a hierarchical level selector 48 that instructs the hierarchical decoder 31 how many hierarchical levels to decode on the basis of a signal received from a clock divider 49. The clock divider 49 divides the clock signal from the clock generator 35, thereby controlling the reproducing speed. The clock divider 49 is itself controlled by a speed switch 50 comprising an up-switch for increasing the speed and a down-switch for decreasing the speed. The clock divider 49 supplies output clock signals to the hierarchical decoder 31 and the digital-to-analog converter 20. This controls the rate at which the hierarchical decoder 31 outputs digitized audio data and the digital-to-analog converter 20 converts the digitized audio data to an analog signal. The clock generator 35 also supplies clock signals to the hierarchical decoder 31 and other elements in FIG. 12, for use by computational circuits in these elements.

The hierarchy code generator 32 and hierarchy code reader 34 shown in FIG. 7 are omitted in FIG. 12 for the sake of simplicity. The description of high-speed reproduction will therefore be limited to the case in which all four hierarchical levels are recorded. The recording is carried out by the hierarchical encoder 30 in the same way as in FIG. 7.

During reproduction, the use can use the up- and down-switches in the speed switch 50 to control the reproduction speed. The clock divider 49 responds by varying the clock frequency division ratio. The hierarchical level selector 48 monitors this frequency division ratio.

The hierarchical decoder 31 comprises, for example, a digital signal processor programmed to execute operations inverse to those performed by the hierarchical encoder 30. When recording and reproduction are performed at the same speed the hierarchical decoder 31 can execute these operations fast enough to decode all four hierarchical levels. However, as the reproduction speed is increased there comes a point at which the hierarchical decoder 31 cannot keep up.

The hierarchical level selector 48 calculates, from the frequency division ratio of the clock divider 49, the maximum number of hierarchical levels the hierarchical decoder 31 will have time to decode at the current reproduction speed, and instructs the hierarchical decoder 31 to decode only that number of levels. Similarly, the read address generator 47 is notified of the frequency division ratio by the clock divider 49 and generates memory addresses only for data on the appropriate hierarchical levels.

Figure 13:
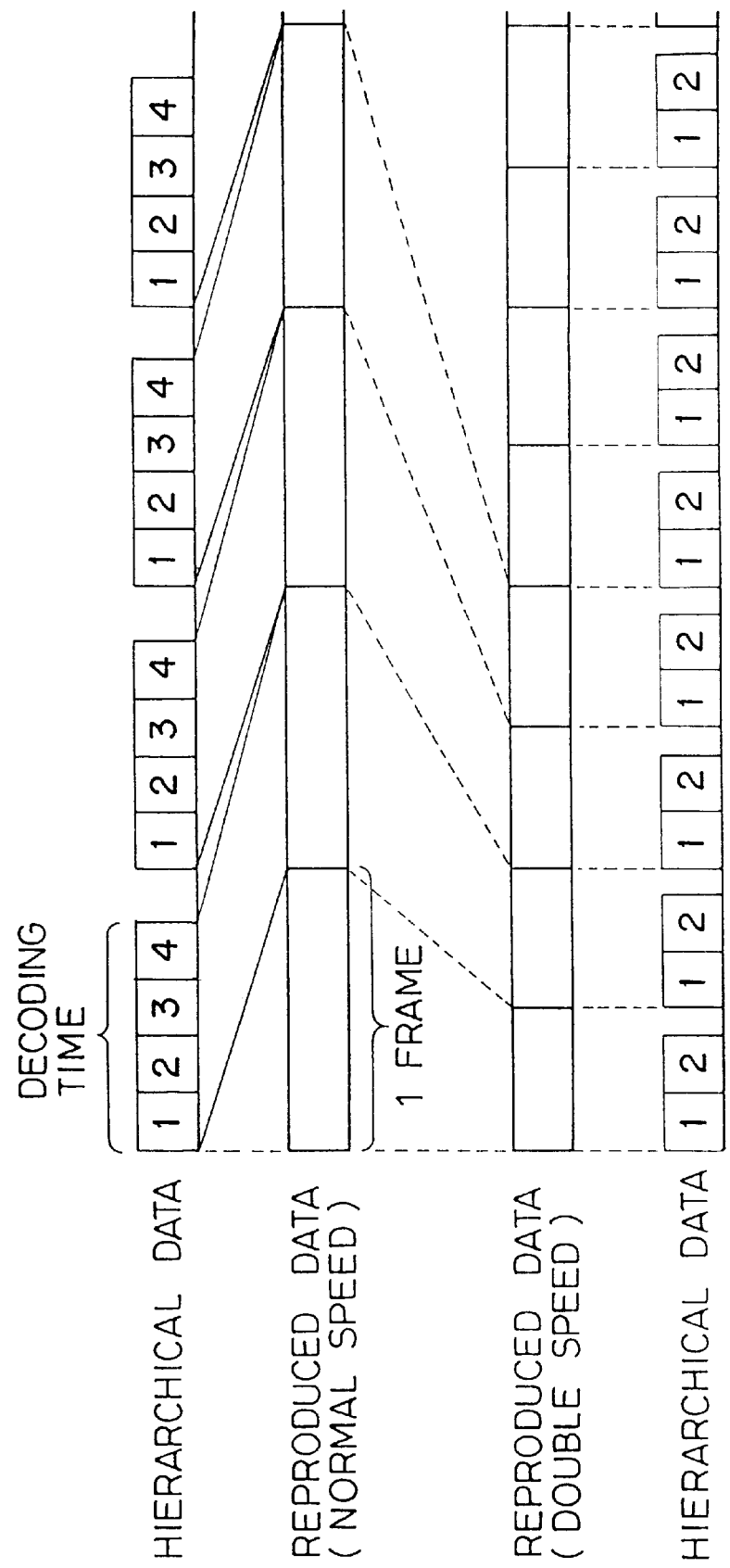
FIG. 13 is a timing diagram illustrating normal-speed and double-speed reproduction.

FIG. 13 illustrates the novel reproducing scheme for cases of normal-speed and double-speed reproduction. At normal speed the hierarchical decoder 31 outputs one frame of audio data while it is reading and decoding the four hierarchical levels of the next frame. At double speed the hierarchical decoder 31 frames are output twice as fast and the hierarchical decoder 31 would no longer have time to decode four hierarchical levels in the time taken to output one frame. Accordingly, the clock divider 49 instructs the hierarchical decoder 31 to decode only two hierarchical levels, as illustrated at the bottom of the drawing.

The high-speed reproduction mode illustrated in FIGS. 12 and 13 shifts the frequency components of the output signal. For example, a 5-kHz frequency component of the original signal becomes a 10-kHz component when played back at double speed, and a 10-kHz component becomes a 20-kHz component. At 10 kHz the threshold of audibility is so high that substantially all reproduced frequencies above 10 kHz usually lie outside the auditory area.

Much of the data in the third and fourth hierarchical levels concerns high-frequency components that are shifted outside the auditory area. These hierarchical levels can therefore be omitted with little loss of fidelity. The method shown in FIG. 13 is accordingly well suited to this type of high-speed reproduction. Moreover, it enables high-speed reproduction to be realized with standard-speed processor hardware, instead of requiring more expensive, high-speed hardware.

Hierarchical recording can be practiced even without transforming the digitized audio data to frequency data. Two particularly simple hierarchical recording methods, employing only two hierarchical levels, will be described next. Both methods employ apparatus of the general type illustrated in FIG. 7.

Figure 14:
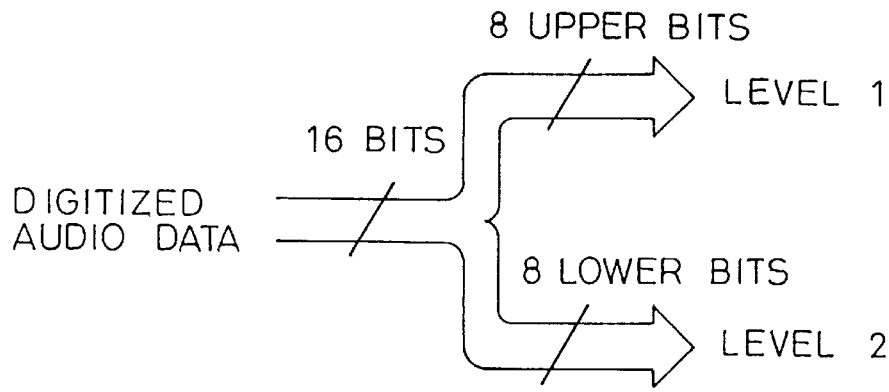
FIG. 14 illustrates a two-level hierarchical recording method.

Referring to FIG. 14, according to one method each audio sample received from the analog-to-digital converter 3 comprises, for example, sixteen bits. The hierarchical encoder 30 simply divides each sample into a most significant eight bits and a least significant eight bits. The most significant eight bits are recorded as the first hierarchical level of data. The least significant eight bits are recorded as the second hierarchical level.

This method is of course not restricted to sixteen-bit audio data. It can be used with N-bit audio data where N is any positive even integer, the most significant N/2 bits being stored as the first hierarchical level and the least significant N/2 bits as the second hierarchical level.

Figure 15:
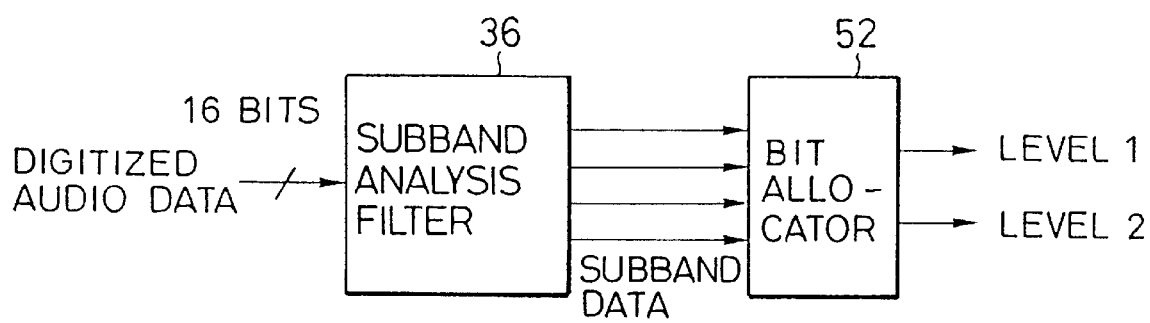
FIG. 15 illustrates a hierarchical encoder for another two-level hierarchical recording method.

Referring to FIG. 15, in another method the hierarchical encoder 30 comprises a subband analysis filter 36 similar to the one in FIG. 10, and a bit allocator 52. The subband analysis filter 36 filters the incoming digitized audio data to generate subband data in a certain number of subbands. Like the incoming digitized audio data, the subband data comprise N-bit sample values. In each subband, the bit allocator 52 allocates a certain number of most significant bits to the first hierarchical level, and the remaining least significant bits to the second hierarchical level.

Figure 16:
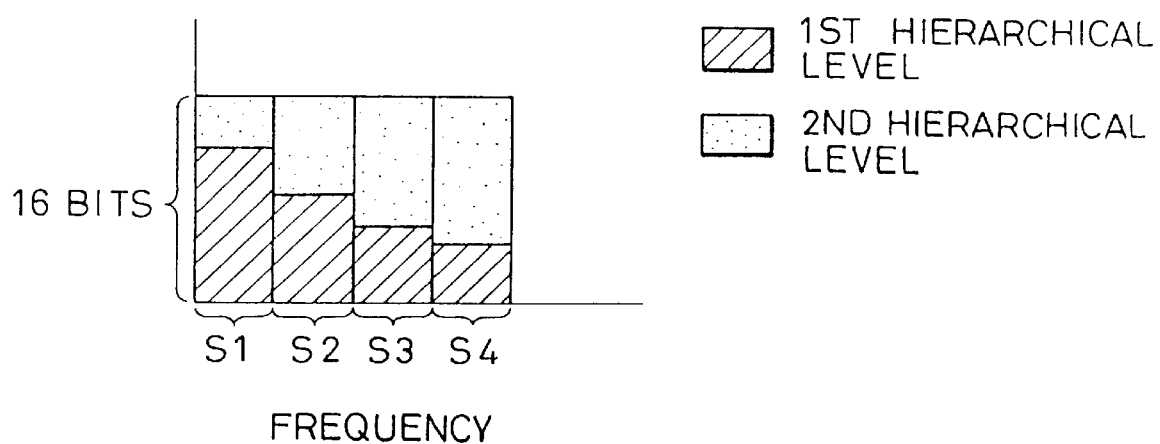
FIG. 16 illustrates the two-level hierarchical recording method of FIG. 15.

FIG. 16 illustrates this method for the case of sixteen-bit samples and four subbands. In the first subband S1 the most significant thirteen bits are allocated to the first hierarchical level and the least significant three bits to the second hierarchical level. In the second subband S2 the most significant nine bits are allocated to the first hierarchical level and the least significant seven bits to the second hierarchical level. In the third subband S3 the most significant six bits are allocated to the first hierarchical level and the least significant ten bits to the second hierarchical level. In the fourth subband S4 the most significant four bits are allocated to the first hierarchical level and the least significant twelve bits to the second hierarchical level. In all, thirty-two bits are allocated to the first hierarchical level and thirty-two bits to the second hierarchical level.

Figure 17:
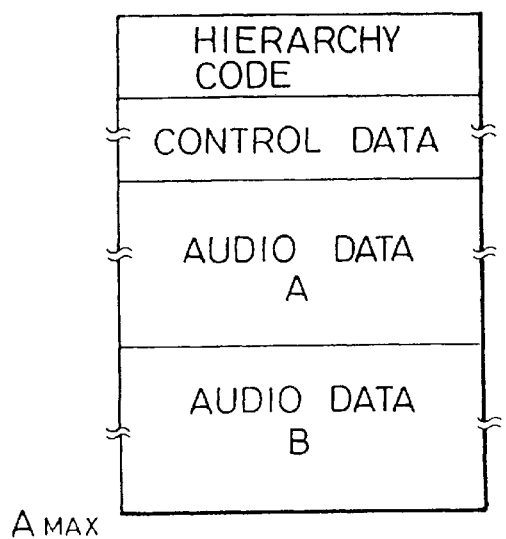
FIG. 17 is a memory map illustrating a two-level hierarchical recording method.

FIG. 17 is a memory map illustrating the recording of audio data under either of the methods illustrated in FIGS. 14, 15, and 16. A hierarchy code of 00 or 01 is recorded together with other necessary control data at the top of the memory address space. Audio sample data on the first hierarchical level are recorded in a first area A. Audio sample data on the second hierarchical level are recorded in a second area B.

Figure 18:
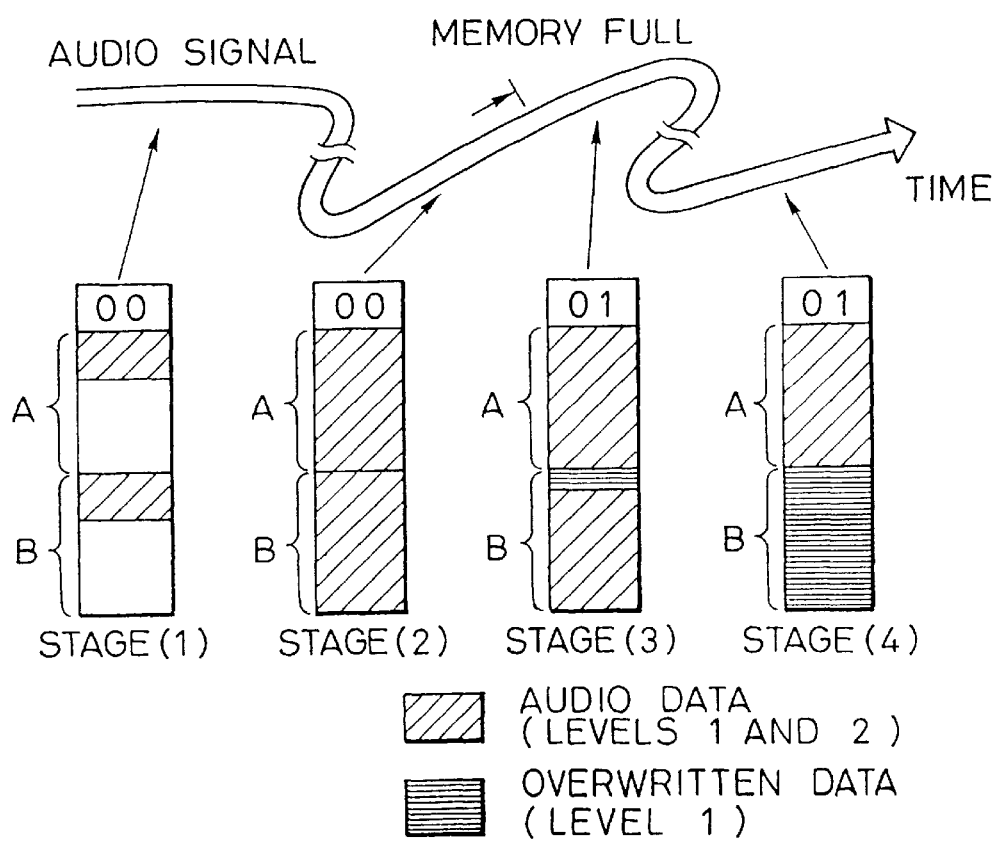
FIG. 18 is a memory map illustrating four stages in two-level hierarchical recording.

FIG. 18 illustrates four stages in a recording made according to the memory map in FIG. 17. In the first stage (1), data of both hierarchical levels are being recorded in respective areas A and B, and the hierarchy code is 00. In the second step (2), areas A and B have become full and the hierarchy code is still 00. In the third stage (3) recording continues by overwriting new data of the first hierarchical level over the existing second-level data in area B, and the hierarchy code is changed to 01. In the fourth stage (4) areas A and B are both filled with data of the first hierarchical level, and the hierarchy code is again 01.

When the audio signal is reproduced, the hierarchy code reader 34 in FIG. 7 reads the hierarchy code recorded at the top of the memory. If the code is 00, indicating that the recording ended in state (1) or (2) in FIG. 18, areas A and B are read simultaneously and the audio signal is reproduced at full fidelity. If the code is 01, indicating that the recording ended in stage (3) or (4) in FIG. 18, first area A is read, then area B is read, and the audio signal is reproduced at lower fidelity, using only the first hierarchical level of data.

Various obvious modifications can be made in the methods shown in FIGS. 14 to 18. For example, the number of hierarchical levels can be increased from two to a higher number. Also, if the recording ends in stage (3) in FIG. 18, since only the first part of area B has been overwritten, the audio signal can be reproduced as follows: the first part of the recording is reproduced using only first-level data in area A: the next part is reproduced using first-level data in area A and still-existing second-level data in area B; the last part is reproduced using first-level data in area B.

Since the methods illustrated in FIGS. 14 to 18 do not convert the digital audio data from the time domain to the frequency domain, they do not require the digital audio data to be encoded into frames. It is possible, however to combine these methods with variable-frame-length recording as follows. The incoming digital audio data are divided into frames of a certain constant length. An energy level is computed for each frame by calculating, for example, the mean-square amplitude of the sample values in that frame. The sample data in each frame are truncated to N bits, where N varies depending on the energy level. Then these N bits are divided into first and second hierarchical level. These processes can be carried out by the bit allocator 52 in FIG. 16. Of course it is then necessary to record bit allocation information as well as the sample data in the semiconductor memory.

With the increasing integration density and capacity of semiconductor memory, it is becoming practical to record audio data not only in embedded semiconductor memories such as the ones commonly used in telephone sets, but also in removable memory devices such as the memory cards employed in recent portable computers. Instead of being limited to a single installed semiconductor memory, the same apparatus can then record and reproduce audio data in any number of removable memories, just as a cassette tape recorder can record and reproduce audio data in any number of tape cassettes.

Figure 19:
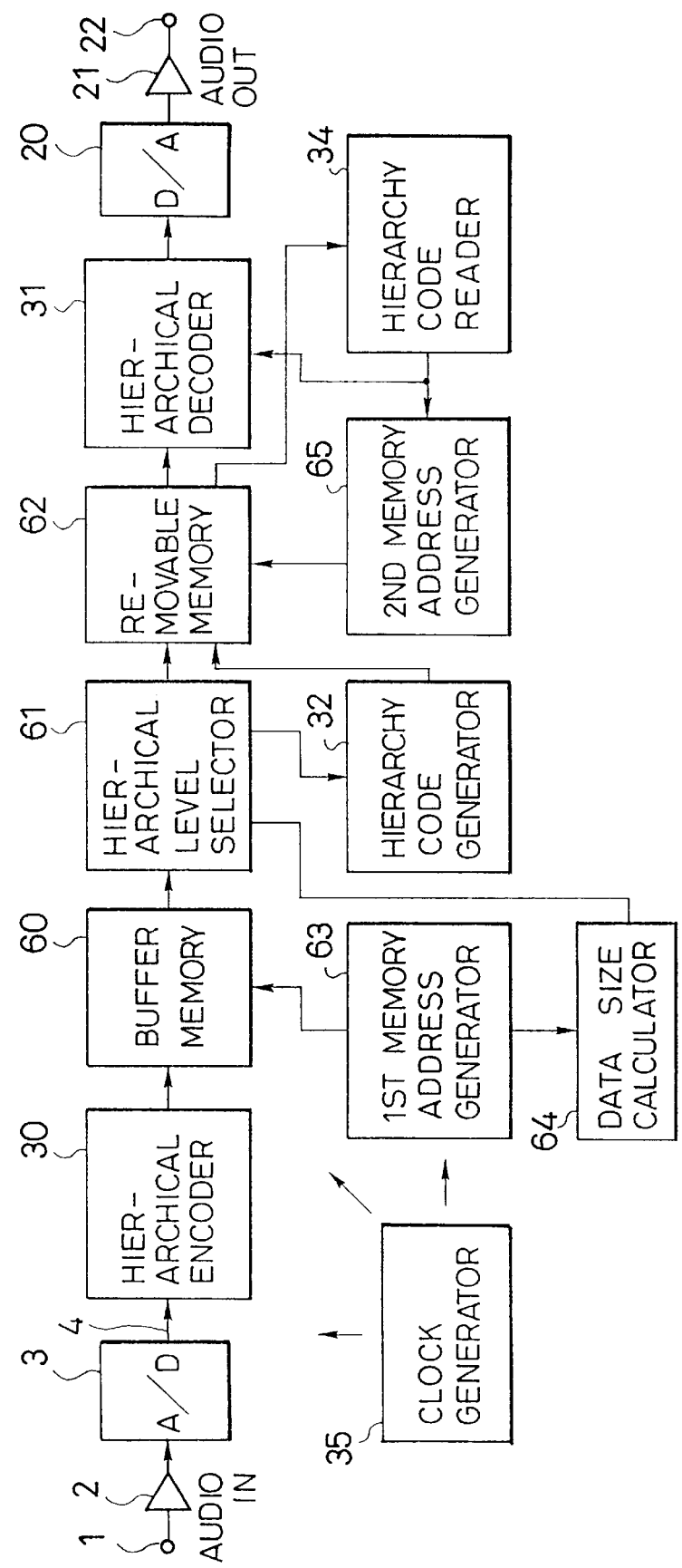
FIG. 19 is a block diagram of a system for hierarchically recording and reproducing audio signals in a removable semiconductor memory.

FIG. 19 illustrates an adaptation of the invention for recording audio signals in a removable semiconductor memory. Elements identical to elements in FIG. 7 have the same reference numerals, and descriptions of these elements will be omitted.

In the apparatus shown in FIG. 19, data generated by the hierarchical encoder 30 are stored in a buffer memory 60 comprising, for example, a plurality of semiconductor memory elements. A hierarchical level selector 61 selects a number of hierarchical levels, reads the recorded data of those hierarchical levels from the buffer memory 60, and writes the data in a removable semiconductor memory 62.

Memory addresses are generated for the buffer memory 60 by a first memory address generator 63, and for the removable semiconductor memory 62 by a second memory address generator 65. From the memory addresses generated by the buffer memory 60, a data size calculator 64 determines the length of the recording.

Next the operation of this apparatus will be described. To make a recording, the input audio signal is encoded by the hierarchical encoder 30, using one of the hierarchical methods already explained, and the encoded data are stored in the buffer memory 60. The buffer memory 60 preferably has a capacity large enough to store all hierarchical levels of data without overwriting any previous data, even if storage of only the first hierarchical level will be possible in the removable semiconductor memory 62.

After a complete recording has been stored in the buffer memory 60, the data size calculator 64 calculates the length of the recording and notifies the hierarchical level selector 61. From this length and the capacity of the removable semiconductor memory 62, the hierarchical level selector 61 calculates the number of hierarchical levels of the recording that can be stored in the removable semiconductor memory 62, and transfers that number of hierarchical levels from the buffer memory 60 to the removable semiconductor memory 62. The hierarchical level selector 61 is adapted for high-speed reading and writing, so that it can transfer data from the buffer memory 60 to the removable semiconductor memory 62 at a faster rate than the data were originally stored in the buffer memory 60. Preferably, the rate is fast enough that the transfer can be accomplished in a time too short to be noticeable to the user of the apparatus. The hierarchical level selector 61 also notifies the hierarchy code generator 32 of the number of levels transferred, and the hierarchy code generator 32 writes a corresponding hierarchy code in the removable semiconductor memory 62 as explained previously.

To reproduce the recorded data, the hierarchy code semiconductor memory 62 and notifies the second memory address generator 65, the second memory address generator 65 generates the necessary memory addresses, and the hierarchical decoder 31 decodes the data at those addresses. Subsequent processes are as already described.

One advantage of the apparatus in FIG. 19 is that after the data have been stored in the removable semiconductor memory 62, the removable semiconductor memory 62 can be removed from the apparatus, another removable semiconductor memory can be inserted, and the same data can be transferred again. This system is accordingly useful for making multiple copies of the recording. The different removable semiconductor memories 62 inserted in the apparatus need not all have the same capacity. The hierarchical level selector 61 can be adapted to detect the capacity of the removable semiconductor memory 62 and vary the number of hierarchical levels transferred accordingly. The apparatus can thus be used to store digital recordings of the same audio signal at different audio fidelity levels in removable semiconductor memories of different capacities.

Another advantage of the apparatus in FIG. 19 is that since no overwriting need be performed, memory address control is simpler. It is not necessary to employ complex addressing schemes such as those illustrated by memory maps in FIGS. 11B–11D.

The scheme illustrated in FIG. 19 is compatible with any of the high-speed reproduction modes described previously. In addition, if variable-frame-length recording is used, the hierarchical level selector 61 can be provided with a mode in which it copies to the removable semiconductor memory 62 only frames having at least a certain minimum length. This thereby removes silent portions of the recording and further increases the amount of information that can be stored in the removable semiconductor memory 62.

Those skilled in the art will notice many other modifications that can be made in the methods and apparatus illustrated in the drawings without departing from the scope of the invention as set forth in the following claims.

What is claimed is:

1. An apparatus for recording a first digitized data in a memory and for reproducing the data, comprising:
   a hierarchical encoder, for encoding said first digitized data to generate a plurality of successive hierarchical levels of data corresponding to the data including a lowest hierarchical level of data for reproduction of the data with relatively low fidelity, and including at least one other higher hierarchical level of data, each successive higher hierarchical level representing additional data for successively relatively greater fidelity, and for writing said hierarchical levels of data into said memory;
   a memory address generator coupled to said hierarchical encoder, for generating memory addresses so that, upon determining that said memory has reached a predetermined storage capacity, recording can continue by overwriting a highest hierarchical level of data previously recorded in said memory with new data of hierarchical levels lower than the overwritten highest hierarchical level;
   a hierarchy code generator coupled to said memory address generator, for recording in said memory, a code indicative of a number of hierarchical levels of data currently recorded therein;
   a hierarchy code reader coupled to said memory, for reading said recorded code; and
   a hierarchical decoder coupled to said memory, for reading a number of hierarchical levels of data designated by said code and for decoding the read data to generate second digitized data.

2. The apparatus of claim 1, wherein said hierarchical encoder comprises:
   a subband analysis filter for filtering said first digitized data and for generating a plurality of subbands of digitized data;
   a plurality of transform processors for converting said generated subbands of digitized data into frequency coefficients;
   a frequency grouper for dividing said frequency coefficients into groups and for combining the frequency coefficients in each group into a single value;
   a bit allocator coupled to said frequency grouper, for allocating a number of bits to each subbands to thereby generate bit allocation information;
   a hierarchical quantizer coupled to receive values output from said frequency grouper, for classifying the values into one of a plurality of hierarchical levels; and
   a formatter coupled to said hierarchical quantizer and said bit allocator, for recording said classified hierarchical levels of values and said bit allocation information in said memory.

3. The apparatus of claim 2, further comprising:
   a block size controller coupled to said subband analysis filter, for specifying sizes of data blocks converted by said plurality of transform processors.

4. The apparatus of claim 2, further comprising:
   a scale factor generator coupled to said frequency grouper and said formatter, for generating scale factors to enable storage of values output by said hierarchical quantizer without loss of significant digits.

5. The apparatus of claim 1, further comprising:
   a digital-to-analog converter coupled to receive said digitized data from said hierarchical decoder, for converting said second digitized data to a signal;
   a clock generator for generating clock signals;
   a clock divider coupled to said clock generator, for dividing said clock signals according to a selectable division ratio and for supplying divided clock signals to said digital-to-analog converter;
   a speed switch coupled to said clock divider, for selecting said division ratio; and
   a hierarchical level selector coupled to said clock divider, for selecting a hierarchical level according to said division ratio and for notifying said hierarchical decoder thereof, thereby causing said hierarchical decoder for decode only hierarchical levels of data which are at most equal to the hierarchical level selected by said hierarchical level selector.

6. The apparatus of claim 5, wherein said hierarchical level selector selects a hierarchical level according to a processing speed of said hierarchical decoder and said division ratio.

7. An apparatus for recording a digitized data in a memory, comprising:
   a hierarchical encoder, for encoding said digitized data to generate a plurality of successive hierarchical levels of data corresponding to the data including a lowest hierarchical level of data for reproduction of the data with relatively low fidelity, and including at least one other higher hierarchical level of data, each successive higher hierarchical level representing additional data for successively relatively greater fidelity;

a buffer memory coupled to said hierarchical encoder, for storing the hierarchical levels of data generated by said hierarchical encoder;

a memory address generator coupled to said buffer memory, for generating memory addresses at which said hierarchical levels of data are stored;

a data size calculator coupled to said memory address generator, for calculating an amount of data stored in said buffer memory;

a hierarchical level selector coupled to said data size calculator, for determining a number of hierarchical levels of data capable of being stored in said memory, and for copying the number of hierarchical levels of data thus determined from said buffer memory to said memory; and a hierarchy code generator coupled to said hierarchical level selector, for recording in said memory a code indicative of a number of hierarchical levels of data recorded therein.

8. The apparatus of claim 7, wherein said memory is a removable memory device.

9. The apparatus of claim 7, wherein said hierarchical level selector is adapted to copy data from said buffer memory to said memory at a rate faster than a data storage rate of said buffer memory.

10. The apparatus of claim 7, wherein said buffer memory has sufficient memory capacity to store all of said hierarchical levels of data, even if said memory has capacity to store only said lowest hierarchical level of data.

11. An apparatus for recording data in a memory, comprising:

an encoder for encoding the data by generating a plurality of successive hierarchical levels of data corresponding to the data including a first hierarchical level of data representing data reproducible at a relatively low fidelity and including at least one other hierarchical level of data higher than the first hierarchical level, each successively higher hierarchical level of data representing data reproducible at a successively relatively greater fidelity; and a controller for controlling said encoder to record said hierarchical levels of encoded data in the memory and, upon determining that the memory has reached a predetermined storage capacity, for controlling the encoder to overwrite a highest hierarchical level of previously recorded encoded data in the memory with new encoded data of hierarchical levels lower than the previously recorded highest hierarchical level of encoded data.

12. The apparatus of claim 11, wherein the controller further controls the encoder to record in the memory, a code indicative of a number of hierarchical levels of data currently recorded therein.

13. The apparatus of claim 12, wherein the encoder encodes input data frame by frame, by generating N hierarchical levels of data for each input frame of data, N being an integer greater than one.

14. The apparatus of claim 12, wherein the code recorded in the memory is updated upon the encoder overwriting each previously recorded highest hierarchical level of data.

15. The apparatus of claim 11, wherein the encoder is controlled to be in one of a write mode for recording encoded data of a successively higher hierarchical level of data into the memory, and an overwrite mode for successively recording, over a highest hierarchical level of data previously recorded in the memory, a first encoded hierarchical level of data and successively higher hierarchical levels of data, each successively higher hierarchical levels being lower than the highest hierarchical levels of data.

16. The apparatus of claim 15, wherein the controller switches the encoder from the write mode to the overwrite mode upon determining that the memory has reached a predetermined storage capacity.

17. The apparatus of claim 11, wherein the encoder encodes input data cumulatively, such that a frame of input data is encoded by generating N hierarchical levels of data, each successively greater hierarchical level of data cumulatively representing data reproducible at a successively relatively greater fidelity, wherein N is an integer greater than one.

18. An apparatus for recording data in a memory, comprising;

an input means for inputting the data encoded by generating a plurality of successive hierarchical levels of data corresponding to the data including a first hierarchical level of data representing data reproducible at a relatively low fidelity and including at least one other hierarchical level of data higher than the first hierarchical level, each successively higher hierarchical level of data representing data reproducible at a successively relatively greater fidelity; and a recording means for recording said encoded data in the memory, wherein when it is determined that the memory has reached a predetermined storage capacity, the recording means is controlled to overwrite a highest hierarchical level of previously recorded encoded data in the memory with new encoded data of hierarchical levels lower than the previously recorded highest hierarchical level of encoded data.

19. An apparatus for processing an input digital signal, comprising:

a first recording medium for recording a hierarchically coded signal obtained by coding the input digital signal, the hierarchically coded signal being divided into a plurality of hierarchical code blocks having respective priorities, the input digital signal being reproducible by decoding of higher-priority code blocks even if lower-priority code blocks are missing:

a decision means coupled to said first recording medium, for deciding whether it is necessary to reduce a total coded size of said hierarchically coded signal; and a hierarchical level conversion means coupled to said decision means, for removing hierarchical code blocks of comparatively low priority from said hierarchically coded signal and outputting hierarchical code blocks of comparatively high priority, responsive to a decision made by said decision means.

20. The apparatus of claim 19, further comprising a second recording medium for receiving and storing the code blocks of comparatively high priority output by said hierarchical level conversion means, classified according to hierarchical level.

21. An apparatus for processing an input digital signal, comprising:

a decision means for deciding whether it is necessary to reduce a total decoded size of a hierarchically coded signal obtained by coding the input digital signal, the hierarchically coded signal being divided into a plurality of hierarchical code blocks having respective priorities, the input digital signal being reproducible by decoding of higher-priority code blocks even if lower-priority code blocks are missing; and a recording means coupled to said decision means, for removing hierarchical code blocks of comparatively low priority from said hierarchically coded signal and recording hierarchical code blocks of comparatively high priority on a recording medium, responsive to a decision made by said decision means.

* * * * *